(12) United States Patent
Widodo et al.

(10) Patent No.: US 7,829,422 B2
(45) Date of Patent: Nov. 9, 2010

(54) INTEGRATED CIRCUIT HAVING ULTRALOW-K DIELECTRIC LAYER

(75) Inventors: Johnny Widodo, Singapore (SG); Huang Liu, Singapore (SG); Sin Leng Lim, Singapore (SG)

(73) Assignee: Chartered Semiconductor Manufacturing, Ltd., Singapore (SG)

( * ) Notice: Subject to any disclaimer, the term of this patent is extended or adjusted under 35 U.S.C. 154(b) by 718 days.

(21) Appl. No.: 11/615,007

(22) Filed: Dec. 22, 2006

(65) Prior Publication Data
US 2008/0153310 A1 Jun. 26, 2008

(51) Int. Cl.
*H01L 21/26* (2006.01)
*H01L 21/42* (2006.01)
(52) U.S. Cl. ...................... 438/308; 438/378
(58) Field of Classification Search ........................ None
See application file for complete search history.

(56) References Cited

U.S. PATENT DOCUMENTS

2008/0124855 A1* 5/2008 Widodo et al. .............. 438/199

FOREIGN PATENT DOCUMENTS

| WO | 02065534 A1 | 8/2002 |
| WO | 03095702 A2 | 11/2003 |

* cited by examiner

*Primary Examiner*—Zandra Smith
*Assistant Examiner*—Pamela E Perkins
(74) *Attorney, Agent, or Firm*—Horizon IP Pte Ltd

(57) ABSTRACT

A device layer is configured to reduce change in stress characteristics due to subsequent processing to reduce cracking of a subsequently formed layer. The change in stress characteristics can be reduced by providing a shield layer over the device layer to protect the device layer from exposure to subsequently processing, such as curing medium used to form voids in an ultralow-k dielectric layer.

24 Claims, 2 Drawing Sheets

INTEGRATED CIRCUIT HAVING ULTRALOW-K DIELECTRIC LAYER

FIELD OF THE INVENTION

The present invention relates to devices such as semiconductor integrated circuits. More particularly, but not exclusively, the invention relates to a semiconductor integrated circuit having curable ultralow-k dielectric layers.

DESCRIPTION OF THE RELATED ART

Integrated circuits (ICs) comprising many tens of thousands of devices including field effect transistors (FETs) and other devices are a cornerstone of modern microelectronic systems. These integrated circuits have structural elements associated with them. As the packing density of the devices increases, the number and complexity of wiring structures forming interconnections between the various elements increases. Connections between the elements of the IC are known as interconnects and are typically arranged in laterally extensive sheets or layers, known as traces. Interconnects within a given trace are separated from one another by an intralevel dielectric, whilst individual traces are separated from one another by layers of an interlevel dielectric. Connections between traces may be made by forming transverse interconnects which are often referred to as 'vias'.

To improve IC performance, ultralow-k (ULK) dielectric materials have been proposed for use to separate traces. One way of forming a ULK dielectric material in an interconnect structure is to deposit a host material containing a porogen (e.g., pore-generating material) over a substrate. Curing the host material removes the porogen, creating voids in the host material. The curing process, for example, involves exposing the host material to ultraviolet (UV) radiation.

Cracking in the ULK material can occur, especially during reliability testing. Cracking of the ULK material is highly undesirable since it may result in delamination of the ULK material and non-uniform dielectric properties. It may also render the integrated circuit structure unsuitable for further processing.

SUMMARY OF THE INVENTION

It is an aim of embodiments of the invention to at least partly mitigate at least one of the above mentioned problems.

It is a further aim of embodiments of the invention to provide an improved interconnect structure for an integrated circuit.

It is a further aim of embodiments of the invention to provide a method of fabricating an improved interconnect structure for an integrated circuit.

According to a first aspect of the present invention there is provided a device comprising:
 a substrate;
 a first layer above the substrate; and
 a dielectric layer above the first layer, wherein the first layer is configured to reduce cracking of the dielectric layer by reducing changes in stress characteristics of the first layer after curing of the dielectric layer.

According to a second aspect of the present invention there is provided a device comprising:
 a substrate;
 a first layer above the substrate, the first layer comprising a first stress; and
 an over-layer above the first layer, wherein the first layer is configured to reduce cracking of the over-layer by reducing changes in the first stress of the first layer that can be caused by subsequent processing.

According to a third aspect of the present invention there is provided a method of forming a device comprising:
 providing a substrate having a prepared upper surface;
 forming a first layer on the upper surface;
 forming a second layer over the first layer;
 forming a dielectric layer over the second layer; and
 exposing the substrate to a curing medium to cure the dielectric layer, wherein the second layer reduces cracking in the dielectric layer caused by exposure to the curing medium.

According to a fourth aspect of the present invention there is provided an integrated circuit structure comprising:
 a substrate;
 a first layer above the substrate;
 a dielectric layer above the first layer; and
 a second layer between the first layer and dielectric layer configured to at least partially prevent transmission of UV radiation incident on said dielectric layer to the first layer.

According to a fifth aspect of the present invention there is provided an integrated circuit structure, comprising:
 a substrate;
 a first layer above the substrate, the first layer comprising a compressively stressed layer;
 a dielectric layer above the first layer, the dielectric layer comprising an ultralow dielectric constant (ULK) material; and
 a second layer between the first layer and dielectric layer configured to at least partially prevent transmission of UV radiation incident on said dielectric layer to the first layer.

According to a sixth aspect of the present invention there is provided a method of forming an integrated circuit structure, comprising the steps of:
 forming a first layer above a substrate;
 forming a dielectric layer above the first layer; and
 forming a second layer between the first layer and the dielectric layer, the second layer being configured to at least partially prevent transmission of UV radiation incident on said dielectric layer to the first layer.

The step of forming the second layer may, in alternative embodiments, comprise a step of forming a layer arranged to at least partially reflect, at least partially absorb, or a combination thereof, UV radiation used for curing the dielectric layer.

In one embodiment, the step of forming the second layer comprises a step of forming a layer of at least one selected from amongst a metal oxide, an organic material or a combination thereof. In one embodiment, the step of forming the second layer comprises a step of forming a layer of metal oxide, wherein the metal oxide comprises aluminium oxide. Alternatively, the step of forming the second layer comprises a step of forming a layer of aluminium oxide doped with at least one selected from amongst zinc oxide and titanium oxide.

In one embodiment, the step of forming a dielectric layer comprises a step of forming a dielectric layer comprising a UV curable material. The dielectric layer, in one embodiment, comprises an ultralow-k dielectric material.

In one embodiment, the step of forming the first layer comprises a step of forming a layer of compressively stressed material. The compressively stressed material, in one embodiment, comprises at least one selected from amongst silicon nitride, silicon carbide, oxygen doped silicon nitride and oxygen doped silicon carbide.

Embodiments of the invention provide an interconnect structure for an integrated circuit wherein the ULK dielectric layer has a reduced propensity to crack. This is because the second layer reduces the amount of curing radiation (e.g. UV radiation) incident on the first layer, thereby preventing a level of stress in the first layer being such as to cause cracking of the ULK layer.

BRIEF DESCRIPTION OF THE DRAWINGS

Embodiments of the present invention will now be described hereinafter, by way of example only with reference to the accompanying drawings, in which.

DETAILED DESCRIPTION OF THE INVENTION

The following detailed description sets forth an embodiment or embodiments in accordance with the present invention employing material cured to form voids therein. The embodiments described are intended to illustrate the invention more fully without limiting their scope, since numerous modifications and variations will be apparent to those skilled in the art.

In the following description, details are set forth such as specific materials, parameters, etc. in order to provide a thorough understanding of the present invention. It will be evident, however, that the present invention may be practiced without these details. In other instances, well-known process steps, equipment, etc. have not been described in particular detail so as not to obscure the present invention.

Hereinafter reference will be made to the term 'interconnect'. It will be understood that the term should be broadly construed to include not only connections between elements of a device, such as an IC, arranged in the form of one or more conductive traces, but also any suitable structure in which one or more conductive lines between elements of a system on a substrate are provided.

Figure 1:
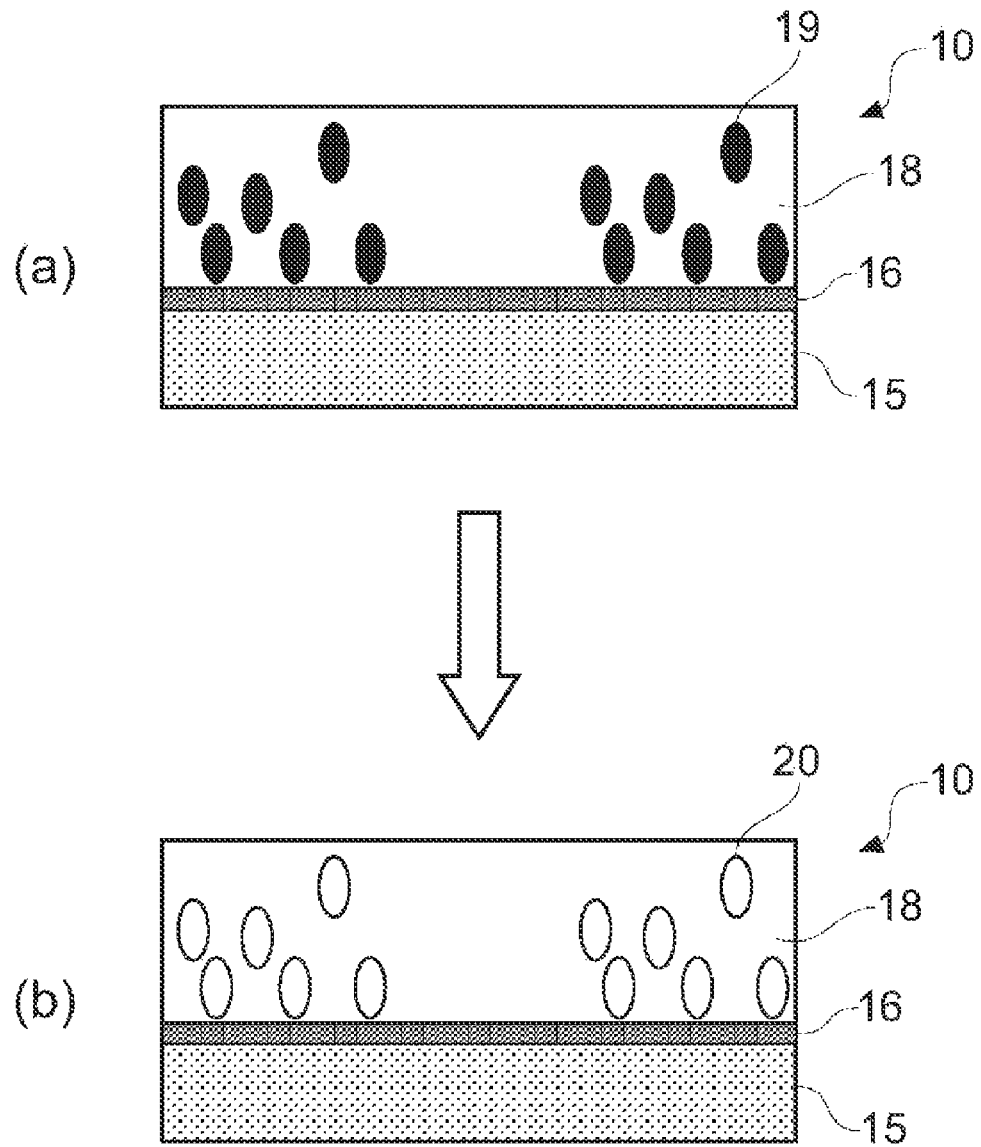
FIG. 1 shows a cross-sectional view of a prior art device structure before and after curing the material by UV radiation.

FIG. 1 shows cross-sectional views of a conventional device structure 10 (a) before and (b) after exposure of the structure to UV radiation.

The structure 10 has an interconnect 15 over which is formed an interconnect capping layer 16. The interconnect is made from copper. The capping layer is made from nitrogen-doped silicon carbide or $SiN_xC_yH_z$ (NBLoK). The NBLoK layer is formed under conditions that result in a compressively stressed NBLoK layer.

Over the capping layer 16 is provided a layer of a host material 18. The host material is a material containing a porogen 19 that is removable upon exposure of the host material to UV radiation. Upon exposure to UV radiation the porogen is removed to leave a void. This results in the formation of a material having an ultralow-k dielectric constant (ULK).

The host material may be diethoxymethylsilane (DEMS) containing a porogen of alpha terpinene (ATRP), which has a composition $C_{10}H_{16}$. ATRP is also known as 1,3-cyclohexadiene, 1 methyl-4-(1 methyl ethyl) or 1-isopropyl-4-methyl-1,3-cyclohexadiene. Alternatively the host material may be dimethoxysilane (DMDMOS), or any other suitable host material. The porogen may be ATRP, or any other suitable porogen.

FIG. 1(b) shows the structure of FIG. 1(a) following exposure of the structure to UV radiation. Exposure to UV radiation results in curing of the host material, whereby voids 20 are formed in the host material at locations occupied by porogen.

As discussed, the host material may experience cracking after curing, especially during reliability testing. In severe instances, the cracks can propagate through the host material and the interconnect capping layer. The cracks can even propagate to adjacent dielectric layers overlying and/or underlying the ULK material.

It has been discovered that cracking of the host material 18 is due to the fact that the capping layer is transformed from a compressively stressed layer to a tensile stressed layer during the curing process to form voids. The change in the stress characteristics of the underlying capping layer causes cracking of the host layer disposed thereover.

Figure 2:
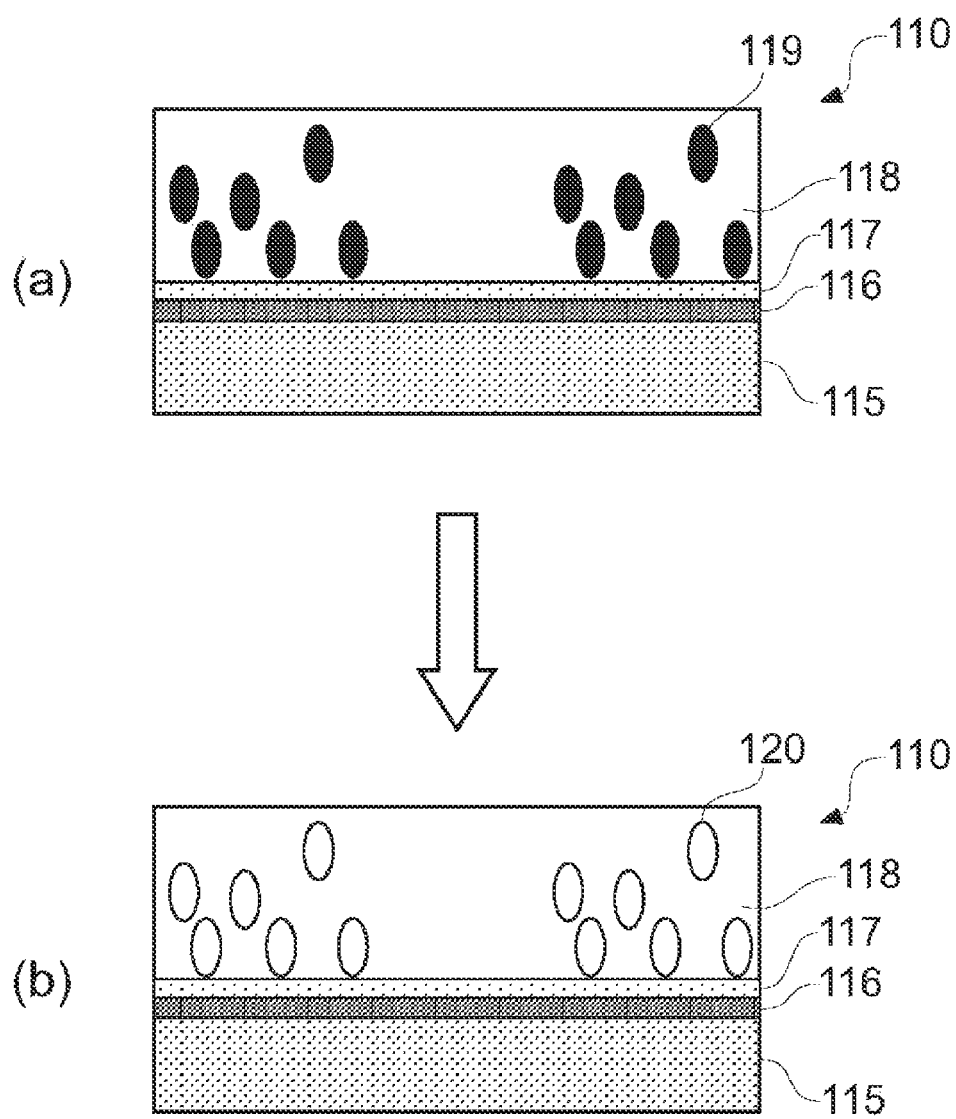
FIG. 2 shows a cross-sectional view of a device structure according to an embodiment of the invention.

FIG. 2 shows a device 110 according to an embodiment of the present invention. The device, for example, can be an integrated circuit or a microelectromechanical system (MEMS). Other types of devices are also useful. For example, the device can be any type of device which employs a material whose stress characteristics can be changed due to processing. The device is shown (a) before and (b) after curing.

The device 110 has a substrate which includes an interconnect 115 formed thereon. The interconnect is made of conductive material. The interconnect, in one embodiment, comprises copper. Other types of conductive materials are also useful. The interconnect can be formed using, for example, damascene techniques. Other techniques, such as reactive ion etch (RIE) or dual damascene, can also be used to form the interconnect. The interconnect 115 may overlie elements of, for example, an integrated circuit such as MOSFET or other elements.

Typically, the device includes additional interconnects and interconnecting layers (not shown) provided above and/or below. A dielectric layer 118 separates the interconnects. Coupling of the different interconnect layers can be achieved by contacts formed in the dielectric layer.

A first layer 116 is formed over the substrate. In one embodiment, the first layer comprises a capping layer. The capping layer is formed on the substrate above the interconnect. The capping layer, for example, acts as a diffusion barrier and/or etch stop layer. In one embodiment, the capping layer comprises a material having a first stress characteristic. In one embodiment, the capping layer comprises NBLoK. NBLoK, for example, is formed as a compressively stressed material. Other types of capping layers are also useful. For example, the capping layer, in some embodiments of the invention, can be compressively stressed SiN, SiC or oxygen doped SiN. Other suitable material with other stress characteristics, alone or in combination, can also be used.

In one embodiment, the capping layer is a blanket layer which covers the surface of the substrate. Alternatively, the capping layer can be formed to selectively cover only the interconnect. In yet another embodiment, the capping layer can comprise a conductive material which selectively cover the interconnect.

An over-layer 118 is provided over the substrate above the capping layer and interconnect. In one embodiment, the over-layer comprises a dielectric layer. The dielectric layer, in one embodiment, comprises a host material containing a porogen 119. The host material is subsequently processed to remove the porogen. Removal of the porogen forms voids in the host material, resulting in an ultralow-k (ULK) material. In one embodiment, processing comprises exposing the host material to a curing medium to remove the porogen. In one embodiment, the host material is cured by exposure to UV radiation. Curing the host material by exposure to other types of curing media, such as electron beam radiation, is also useful.

In one embodiment, the host material is diethoxymethylsilane (DEMS). In alternative embodiments, the host material is dimethyl dimethoxysilane (DMDMOS), or any other suitable host material. The porogen, in one embodiment, comprises ATRP. Other types of porogens or combination of porogens are also useful.

The processing of the host material can cause a change in the stress characteristics of the first layer. For example, the curing process such as exposure to UV radiation can change the capping layer from a compressively stressed material to a tensile stressed material. This change in stress characteristic can result in cracking in the host material.

In accordance with the invention, the first layer is configured to reduce changes in stress characteristics caused by subsequent processing sufficiently to reduce cracking in layer(s) disposed above and/or below. In one embodiment, the first layer is configured such that the stress characteristics of the layer is of the same type before and after subsequent processing. For example, a compressively stressed first layer is maintained as a compressively stressed first layer after subsequent processing. Preferably, the first layer is configured to reduce changes in stress characteristics to prevent cracking in the layer(s) disposed above and/or below.

In one embodiment, the first layer is configured by providing a second layer 117 over the first layer. In one embodiment, a second layer is provided over the capping layer. The second layer may be directly overlying the first layer or there may be intervening layers e.g. adhesive layers between them. The second layer reduces cracking in the overlying dielectric layer which can be caused by subsequent processing. For example, the subsequent processing can be curing the dielectric layer to form voids therein. The curing process comprises exposing the dielectric layer to a curing medium, such as UV radiation. Other types of curing media, such as electron beam radiation, are also useful.

In one embodiment, the second layer acts as a shield layer to protect the capping layer from exposure to the curing medium. For example, the shield layer at least partially reflects, at least partially absorbs, or a combination thereof, at least partially the curing medium. Preferably, the shield layer reflects, absorbs, or a combination thereof, all of the curing medium. In one embodiment, the curing medium comprises UV radiation. Protecting the capping layer from other types of curing media, such as electron beam radiation, is also useful.

In one embodiment, the shield layer comprises aluminium oxide ($Al_2O_3$). Aluminium oxide has the property that it at least partially reflects UV radiation. It will be appreciated that in some embodiments of the invention, aluminium oxide containing ZnO and/or $TiO_2$, or any other suitable material, may be used. The thickness of the shield layer is, for example, about 50 Å thick. Other thicknesses may also be useful.

ZnO and $TiO_2$ have UV-absorptive properties. Their presence as constituents of the aluminium oxide layer, e.g. as dopants, has the advantage that absorption of UV light by the shield layer 117 occurs when they are present, in addition to reflection of UV light by the shield layer 117 due to the presence of aluminium oxide.

In still further embodiments of the invention, the shield layer 117 may be formed from a functionally equivalent material other than aluminium oxide. A functionally equivalent material is a material that at least partially prevents UV light from passing through the shield layer 117 to the underlying capping layer 116. For example, the shield layer may be formed from a metal oxide, such as ZnO, $TiO_2$ or a combination thereof. The metal oxide can be combined with an organic material, such as methoxycinnamate or octyl salicylate. Other types of materials which protect the capping layer from exposure to the curing medium are also useful.

Herrmann et al. (Micromachining and Microfabrication ProcessTechnology X, edited by Mary-Ann Maher, Harold D. Stewart, Proc. of SPIE Vol. 5715 (SPIE, Bellingham, Wash., 2005), pages 159 to 166), incorporated herein by reference, describe the formation of aluminium oxide/zinc oxide dielectric using atomic layer deposition (ALD). It will be appreciated however that other methods of forming a shield layer 117 having a layer of aluminium oxide/zinc oxide dielectric may also be used, in addition to or in place of ALD.

For example, the shield layer 117 may be formed by conventional deposition processes including chemical vapour deposition, sputtering, or any other suitable deposition technique.

The first layer can also have other configurations which reduce changes in stress characteristics caused by subsequent processing. For example, the first layer can be configured with a second layer which compensates for the first layer's change in stress characteristics caused by subsequent processing. The net change in stress characteristics between the layers would therefore be reduced. Other configurations which reduce changes in stress characteristics caused by subsequent processing are also useful. For example, the first layer can be configured with a second layer which absorbs the change in stress characteristics of the first layer.

FIG. 2(b) shows the structure of FIG. 2(a) following exposure of the structure to a curing medium. In one embodiment, the curing medium comprises UV radiation. Inspection of the structure of FIG. 2(b) reveals that cracking of the ULK material does not occur in the presence of shield layer 117. This is due to the fact that capping layer 116 remains compressively stressed during the UV curing process. The capping layer 116 remains compressively stressed during the UV curing process due to a reduced exposure of the capping layer 116 to UV radiation, since shield layer 117 reduces the amount of UV radiation (if any) incident on the capping layer 116.

Embodiments of the invention have the advantage that cracking of ULK dielectric layers during curing of the host material is reduced or eliminated.

Throughout the description and claims of this specification, the words "comprise" and "contain" and variations of the words, for example "comprising" and "comprises", means "including but not limited to", and is not intended to (and does not) exclude other moieties, additives, components, integers or steps.

Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics, compounds, chemical moieties or groups described in conjunction with a particular aspect, embodiment or example of the invention are to be understood to be applicable to any other aspect, embodiment or example described herein unless incompatible therewith.

What is claimed is:

1. A device comprising:
   a substrate prepared with a lower dielectric layer, the lower dielectric layer includes a conductive interconnect formed therein;
   a capping layer disposed over the interconnect;

a protective layer disposed over the capping layer; and an upper dielectric layer disposed above the protective layer, wherein the protective layer is configured to reduce changes in stress characteristics of the capping layer caused by exposure to radiation used in curing of the upper dielectric layer.

2. The device of claim 1 wherein:

the capping layer comprises SiN, SiC, oxygen doped SiN, nitrogen doped silicon carbide or SiNCH; and the protective layer reduces changes in stress characteristics of the capping layer by absorbing or reflecting or a combination thereof the radiation used in curing the upper dielectric layer.

3. The device of claim 2 wherein the protective layer minimizes changes in stress characteristics of the capping layer by reducing exposure of the capping layer to the radiation.

4. The device of claim 3 wherein the radiation comprises UV radiation.

5. The device of claim 1 wherein the capping layer comprises a compressive stress, the capping layer maintains the compressive stress after curing of the upper dielectric layer.

6. The device of claim 1 wherein the radiation for curing the dielectric layer comprises UV radiation.

7. The device of claim 6 wherein the upper dielectric layer comprises an ultralow-k dielectric material.

8. The device of claim 7 wherein:

the capping layer comprises a compressively stressed material selected from SiN, SiC, oxygen doped SiN, nitrogen doped silicon carbide or SiNCH or a combination thereof; and the protective layer reduces changes in stress characteristics of the capping layer by absorbing or reflecting or a combination thereof the radiation used in curing the upper dielectric layer.

9. The device of claim 1 comprises an integrated circuit or microelectromechanical system (MEMS) device.

10. The device of claim 9 wherein:

the capping layer comprises a compressively stressed material selected from SiN, SiC, oxygen doped SiN, nitrogen doped silicon carbide or SiNCH or a combination thereof; and the upper dielectric layer comprises an ultralow-k dielectric layer.

11. The device of claim 9 wherein the radiation for curing the dielectric layer comprises UV radiation.

12. The device of claim 11 wherein:

the capping layer comprises a compressively stressed material selected from SiN, SiC, oxygen doped SiN, nitrogen doped silicon carbide or SiNCH or a combination thereof; and the dielectric layer comprises an ultralow-k dielectric layer.

13. The device of claim 1 wherein the protective layer protects the capping layer from exposure to a curing medium the radiation to reduce cracking of the upper dielectric layer.

14. The device of claim 13 wherein the capping layer comprises aluminium oxide.

15. The device of claim 13 wherein the capping layer comprises a metal oxide.

16. The device of claim 13 wherein the capping layer comprises a metal oxide and an organic material.

17. The device of claim 13 wherein the capping layer comprises a material selected from aluminium oxide, zinc oxide, titanium oxide or a combination thereof.

18. A device comprising:

a substrate;

a capping layer disposed over the substrate the capping layer comprising a first stress;

a protective layer disposed over the capping layer; and a device layer in which features are formed is disposed over the protective layer, the device layer comprises a processed device layer which has been processed by exposure to radiation wherein the protective layer protects the capping layer from exposure to the radiation used in processing the device layer to reduce changes in the first stress of the capping layer which can cause cracking of the device layer thereover.

19. A method of forming a device comprising:

providing a substrate having a prepared upper surface of a lower dielectric layer, the lower dielectric layer includes a conductive interconnect formed therein, wherein the upper interconnect has a top surface coplanar with the upper surface;

forming a capping layer on the upper surface;

forming a protective layer over the capping layer;

forming an upper dielectric layer over the protective layer; and exposing the substrate to a curing medium to cure the upper dielectric layer, wherein the protective layer protects the capping in layer from exposure to the curing medium which reduces changes in stress characteristics of the capping layer which can cause cracking in the upper dielectric layer.

20. The method of claim 19 wherein:

the capping layer comprises SiN, SiC, oxygen doped SiN, nitrogen doped silicon carbide or SiNCH; and the protective layer reduces changes in stress characteristics of the capping layer by absorbing or reflecting or a combination thereof the radiation used in curing the upper dielectric layer.

21. The method of claim 19 wherein the upper dielectric layer comprises an ultralow-k dielectric layer.

22. The method of claim 19 wherein the capping layer comprises a compressive stress, the capping layer maintains the compressive stress after curing of the upper dielectric layer.

23. The method of claim 19 wherein the curing medium comprises UV radiation.

24. A device comprising:

a substrate prepared with a top surface;

a capping layer disposed over the top surface;

a protective layer disposed over the capping layer; and a device layer disposed above the protective layer, wherein the protective layer is configured to reduce changes in stress characteristics of the capping layer caused by exposure to radiation used in curing of the device layer, wherein the changes in stress characteristics can cause cracking in the device layer.

* * * * *